(12) United States Patent
Scherer et al.

(10) Patent No.: US 6,936,141 B2
(45) Date of Patent: Aug. 30, 2005

(54) DRY ETCHING AND MIRROR DEPOSITION PROCESSES FOR SILICONE ELASTOMER

(75) Inventors: Axel Scherer, Laguna Beach, CA (US); Mark Adams, Pasadena, CA (US)

(73) Assignee: California Institute of Technology, Pasadena, CA (US)

(*) Notice: Subject to any disclaimer, the term of this patent is extended or adjusted under 35 U.S.C. 154(b) by 163 days.

(21) Appl. No.: 10/068,283

(22) Filed: Feb. 5, 2002

(65) Prior Publication Data

US 2002/0148813 A1 Oct. 17, 2002

Related U.S. Application Data

(60) Provisional application No. 60/269,762, filed on Feb. 16, 2001.

(51) Int. Cl.[7] .......................... C23C 16/00; C23C 14/34
(52) U.S. Cl. ......................... 204/192.14; 204/192.12; 430/494; 427/255.11
(58) Field of Search ...................... 204/192.12, 192.14; 430/494; 427/255.11

(56) References Cited

U.S. PATENT DOCUMENTS 5,906,871 A * 5/1999 Takebe et al. ............... 428/29
6,280,642 B1 * 8/2001 Ikeda et al. .................. 216/27

* cited by examiner

Primary Examiner—Rodney G. McDonald
(74) Attorney, Agent, or Firm—Daniel L. Dawes; Myers Dawes Andras & Sherman LLP

(57) ABSTRACT

According to the invention semiconductor processing procedures can be applied to silicone elastomeric materials. The surface tension of the elastomeric material is changed by depositing a thin layer of silicon, silicon nitride, silicon dioxide or a combination thereof onto the elastomer's exposed surface. In the illustrated embodiment it is shown that it is possible to deposit a thin layer of silicon dioxide onto the elastomer's exposed surface through re*active sputter deposition of silicon dioxide within an argon-oxygen plasma. In another plasma fabrication procedure, the elastomer material is directionally etched using a standard RF plasma etching system and a dry chemical oxygen-Freon removal procedure, which procedure volatilizes all of the components of the polydimethylsilicone (PDMS) or GE's RTV elastomer material.

15 Claims, 1 Drawing Sheet

DRY ETCHING AND MIRROR DEPOSITION PROCESSES FOR SILICONE ELASTOMER

RELATED APPLICATIONS

The present application is related to and claims priority under 35 USC 120 to U.S. Provisional Patent Application Ser. No. 60/269,762 filed Feb. 16, 2001.

BACKGROUND OF THE INVENTION

Silicon elastomers, such as polydimethylsilicone or General Electric's room temperature vulcanizable (RTV) silicone elastomer compounds, have recently become very interesting materials for the construction of fluid flow systems. This is partly a result of the low modulus of elasticity, which enables the deformation of these materials with small applied pressures and very easy integration into small valves and pumps. Another advantage these materials bring with them is the easy processing of microstructures into them by replication molding or embossing. Finally, these materials are generally biocompatible and have been optimized to seal hermetically to most surfaces such as $Si_3N_4$ or $SiO_2$.

Apart from replication molding, injection molding or embossing, there are presently few other methods for processing these technologically important materials. Indeed, the fluidic devices which are used for pumping, examining and sorting of small quantities of solutions are generally fabricated by either replication molding or embossing the elastomer material using a microfabricated die. Conventional photoresist processing is more difficult on elastomers since the large surface tension prevents the spin-coating of continuous films with uniform thickness. Chemical etching of these materials is also difficult, due to the very stable chemical structure. Organic solvents such as toluene are usually used to dissolve silicone elastomers, but such dissolution does not yield a directional pattern transfer.

What is needed is some type of methodology whereby elastomers may be microfabricated without the difficulties and limitations of prior art methods.

BRIEF SUMMARY OF THE INVENTION

The invention is defined in one embodiment as an improvement in a method of microfabricating elastomeric material having a characterizing surface tension. The method comprises the steps of decreasing the surface tension of the elastomeric material and photolithographically processing the elastomeric material with decreased surface tension.

The step of decreasing the surface tension of the elastomeric material comprising in the illustrated embodiment the step of forming a silicon dioxide layer on the elastomeric material. In particular the silicon dioxide layer is formed on the elastomeric material by sputter deposing silicon dioxide on the elastomeric material in an argon-oxygen plasma.

The improvement also comprises the step of forming a silicon nitride layer on the elastomeric material by sputter deposing silicon nitride on the elastomeric material in an argon-nitrogen plasma.

The invention still further comprises the embodiment of decreasing the surface tension of the elastomeric material by forming a silicon layer on the elastomeric material by sputter deposing silicon on the elastomeric material in an argon plasma.

The invention also comprises the step of forming a silicon nitride layer on the silicon dioxide layer by the above steps.

In the illustrated embodiment the invention is practiced on poydimethylsilicone and room temperature vulcanizable (RTV) silicone elastomer, but it is to be expressly understood that any elastomer whose surface tension can be decreased by providing a silicon coating of some kind is included within the scope of the invention.

The invention is also defined as a method of directionally etching an elastomeric material comprising the steps of providing an RF plasma etching system, creating an oxygen plasma in the presence of Freon in the RF plasma etching system, and removing silicon tetrafluoride from the RF plasma etching system. The silicon tetrafluoride is removed from the RF plasma etching system by pumping the silicon tetrafluoride out of the RF plasma etching system. In the illustrated embodiment an oxygen plasma in the presence of Freon is created using an approximately 90% oxygen and 10% Freon mixture. It is expressly to be understood that other oxygen-Freon mixtures may be used as equivalent to the one chosen for illustration. The silicon tetrafluoride is removed from the RF plasma etching system by maintaining the oxygen plasma under a partial vacuum of approximately 400 mTorr. The hardness of the vacuum is not critical and other pump-off conditions may be employed.

In the illustrated embodiment new methods are described which overcome these difficulties and describe how to fabricate structures on silicon elastomer by using conventional microfabrication technologies used in the microelectronics industry, such as plasma etching and by deposition of thin adhering inorganic layers.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112. The invention can be better visualized by turning now to the following drawings wherein like elements are referenced by like numerals.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

Figure 1:
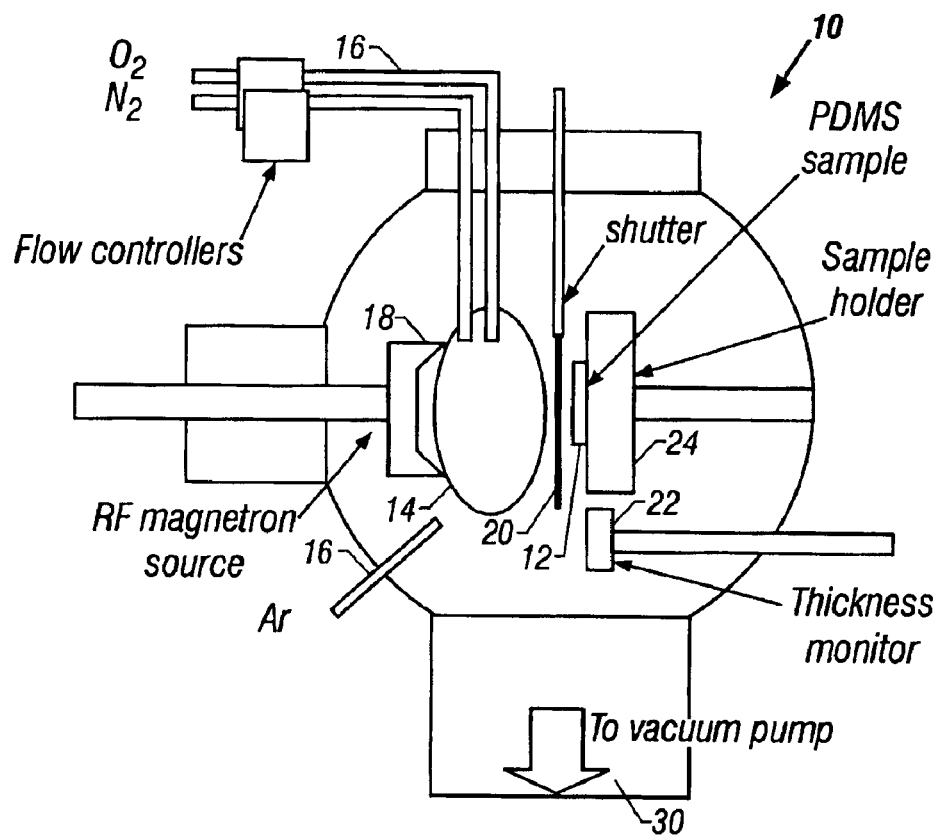
FIG. 1 is a simplified diagrammatic side view of a reactive sputter deposition system in which the method of the invention may be practiced.

According to the invention semiconductor processing procedures can be applied to silicone elastomeric materials. One of the difficulties of using photolithographic techniques has been the high surface tension of the elastomer. This surface tension can be changed by depositing a thin layer of silicon dioxide onto the elastomer's exposed surface. In the illustrated embodiment it is shown that it is possible to deposit a thin layer of silicon dioxide onto the elastomer's exposed surface through reactive sputter deposition of silicon dioxide within an argon-oxygen plasma. One apparatus used to deposit such oxide layers is shown in the simplified diagram of FIG. 1. A silicon sputter-target 12 is sputtered in a reactive gas mixture with chamber 14 of either argon and oxygen for $SiO_2$ layer deposition, an argon and nitrogen mixture for SiN layer deposition, or argon for Si layer deposition. The gas for constituting the plasma in chamber 14 is provided gas sources 16. A conventional RF magnetron source 18 energizes the plasma in vacuum chamber 14. A shutter 20 may be provided between the plasma and target 12 to provide additional deposition control. The thickness of deposition onto target 14 is monitored by thickness monitor 22, which is a is a RF compatible Inficon XTC quartz crystal oscillator based thin film thickness monitor in the illustrated embodiment. Target 12 is supported on a sample holder 24 in the target position behind shutter 20 and in the plasma flow. The apparatus in which the methodology is performed as shown in FIG. 1 is conventional and it must understood that many different equivalent systems could be employed as are now known or later devised.

This deposition results in a silicon dioxide layer which adheres remarkably well to the exposed elastomer surface, and can be used to change the surface tension of the sample surface. Photoresist can readily be deposited onto this oxide layer by a standard spin-on process for additional processing steps if desire according to conventional photolithographic techniques. Conversely, the deposition of silicon dioxide in $ArO_2$ plasmas can be followed by silicon or silicon nitride deposition in $Ar/N_2$ plasmas, and the desired number and order of layers can be deposited onto the initial oxide layer for further processing, such as for metalizations or mask deposition.

As one example of the methodology of the invention we have used the method of the invention for depositing high-reflectivity mirrors based on conventional dielectric stacks (also called distributed Bragg reflectors or quarter-wave mirrors) onto silicone elastomer by alternately depositing $SiO_2$ and SiN layers with thicknesses corresponding to one quarter of a wavelength for which the mirror is designed.

In another plasma fabrication procedure, we have developed a technique necessary to directionally etch the elastomer material. For this process, we use a standard RF plasma etching system and a dry chemical removal procedure to execute the directional etch, which procedure volatilizes all of the components of the polydimethylsilicone (PDMS) or GE's RTV elastomer material. These recipes have resulted in high etch rates and with smooth etched surfaces.

Typical parameters which have been developed are:
Pressure: 400 mTorr
Gas composition: 90% Oxygen /10%$CF_4$
Gas flow rate: 20 standard cubic centimeters
Temperature: Room temperature
Etch rate: 1–2 micrometers/minute of 10:1 RTV (PDMS)

Figure 2:
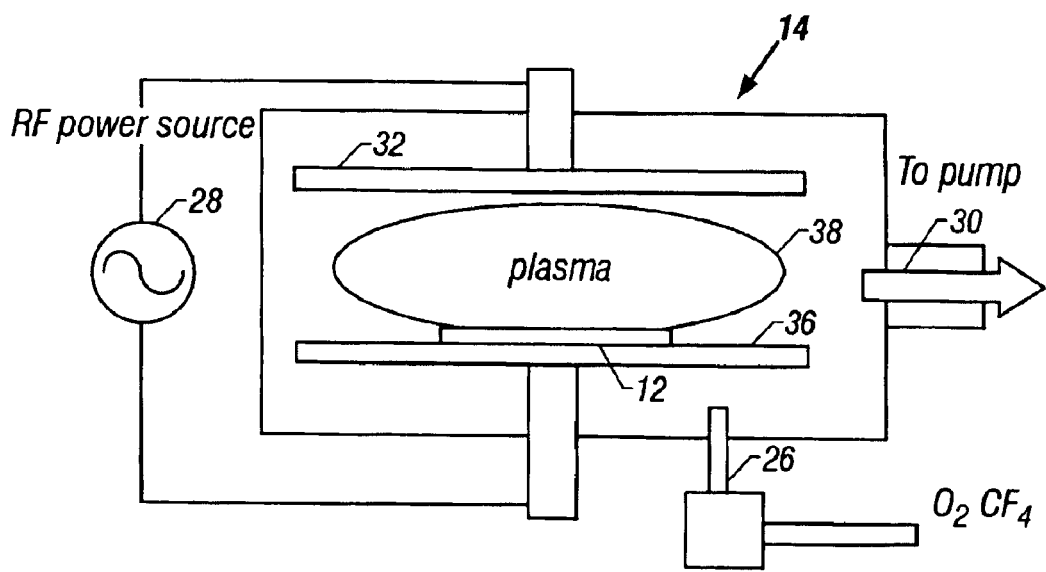
FIG. 2 is a simplified diagrammatic side view of a plasma etching system in which the directional etching of an elastomer may be practiced using an oxygen plasma in an oxygen-Freon mixture.

By using oxygen and Freon as an etch gas mixture in chamber 14, we ensure the volatilization of the organic materials in the oxygen plasma 38, forming carbon monoxide or carbon dioxide. The silicon in the silicone chains of the elastomer in sample 12 are in turn volatilized by forming silicon tetrafluoride which can also be pumped away by pumping system 30. FIG. 2 is a simplified diagrammatic sketch of a chamber 14 in which the directional etching methodology is employed. An elastomeric sample 12 is placed on an RF electrode 36 and positioned opposite RF electrode 32. RF source 28 is coupled between electrodes 36 and 32 so that $O_2$ and $CF_4$ inserted from source 26 into chamber 14 is energized into a plasma 38 between electrodes 36 and 32. Chamber 14 is maintained under vacuum by a vacuum pumping system 30 exterior to, but communicated with chamber 14.

It is worth noting that when etching silicone elastomers with a pure oxygen plasma, one very quickly reaches a limiting etch depth, since silicon dioxide surfaces form during the oxygen etch process and provide excellent mask layers which prevent deeper pattern transfer. Argon milling is a very slow alternative for etching these materials, and does not provide very straight sidewalls. Thus, the freon-oxygen combination described above provides an excellent opportunity to create very directional via-holes through the elastomer and results in a conventional alternative to molding and embossing to define high resolution structures in this material.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. An improvement in a method of microfabricating three dimensional structure in deformable silicone elastomer comprising photolithographically fabricating the three dimensional structure in the deformable silicone elastomer using semiconductor fabricating procedures, including reactive sputter deposition of a layer including silicon thereon to allow for the formation of masking layers on the layer sputtered on the silicone elastomer by means of which the structure is photolithographically microfabricated.

2. An improvement in a method of microfabricating elastomeric material having a characterizing surface tension comprising decreasing the surface tension of the elastomeric material and photolithographically processing the elastomeric material with decreased surface tension, where decreasing the surface tension of the elastomeric material comprising forming a silicon dioxide layer on the elastomeric material.

3. The improvement of claim 2 where forming a silicon dioxide layer on the elastomeric material comprises sputter depositing silicon dioxide on the elastomeric material.

4. An improvement in a method of microfabricating an elastomeric material having a characterizing surface tension comprising decreasing the surface tension of the elastomeric material and photolithographically processing the elastomeric material with decreased surface tension, where decreasing the surface tension of the elastomeric material comprises forming a silicon dioxide layer on the elastomeric material by sputter depositing silicon dioxide on the elastomeric material in an argon-oxygen plasma.

5. An improvement in a method of microfabricating elastomeric material having a characterizing surface tension comprising decreasing the surface tension of the elastomeric material and photolithographically processing the elastomeric material with decreasing surface tension, where decreasing the surface tension of the elastomeric material comprising forming a silicon nitride layer on the elastomeric material.

6. The improvement of claim 5 where forming a silicon nitride layer on the elastomeric material comprises sputter depositing silicon nitride on the elastomeric material.

7. The improvement of claim 6 where sputter depositing silicon nitride on the elastomeric material comprises sputter depositing silicon nitride in an argon-nitrogen plasma.

8. An improvement in a method of microfabricating elastomeric material having a characterizing surface tension comprising decreasing the surface tension of the elastomeric material and photolithographically processing the elastomeric material with decreased surface tension, where decreasing the surface tension of the elastomeric material comprising forming a silicon layer on the elastomeric material.

9. The improvement of claim 8 where forming a silicon layer on the elastomeric material comprises sputter depositing silicon on the elastomeric material.

10. The improvement of claim 9 where sputter depositing silicon on the elastomeric material comprises sputter depositing silicon in an argon plasma.

11. The improvement of claim 2 further comprising forming a silicon nitride layer on the silicon dioxide layer.

12. The improvement of claim 11 where forming a silicon nitride layer comprises sputter depositing silicon nitride on the silicon dioxide layer.

13. The improvement of claim 12 where sputter depositing silicon nitride on the silicon dioxide layer comprises sputter depositing silicon nitride in an argon-nitrogen plasma.

14. The method of claim 2 where decreasing the surface tension of the elastomeric material decreases the surface tension of polydimethylsilicone.

15. The method of claim 2 where decreasing the surface tension of the elastomeric material decreases the surface tension of a room temperature vulcanizable (RTV) silicone elastomer (silanodimethyl polydimethylsiloxane).

* * * * *